(12) United States Patent
Okagawa et al.

(10) Patent No.: US 8,946,772 B2
(45) Date of Patent: Feb. 3, 2015

(54) SUBSTRATE FOR EPITAXIAL GROWTH, PROCESS FOR MANUFACTURING GAN-BASED SEMICONDUCTOR FILM, GAN-BASED SEMICONDUCTOR FILM, PROCESS FOR MANUFACTURING GAN-BASED SEMICONDUCTOR LIGHT EMITTING ELEMENT AND GAN-BASED SEMICONDUCTOR LIGHT EMITTING ELEMENT

(75) Inventors: Hiroaki Okagawa, Ibaraki (JP); Hiromitsu Kudo, Ibaraki (JP); Teruhisa Nakai, Ibaraki (JP); Seong-Jin Kim, Hyogo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 242 days.

(21) Appl. No.: 12/867,787

(22) PCT Filed: Feb. 13, 2009

(86) PCT No.: PCT/JP2009/052432
§ 371 (c)(1),
(2), (4) Date: Jan. 7, 2011

(87) PCT Pub. No.: WO2009/102033
PCT Pub. Date: Aug. 20, 2009

(65) Prior Publication Data
US 2011/0198560 A1    Aug. 18, 2011

(30) Foreign Application Priority Data

Feb. 15, 2008    (JP) ............................... P2008-034275

(51) Int. Cl.
| | | |
|---|---|---|
| *H01L 21/02* | (2006.01) |
| *C23C 16/30* | (2006.01) |
| *C23C 16/02* | (2006.01) |
| *C30B 25/18* | (2006.01) |
| *C30B 29/40* | (2006.01) |
| *H01L 33/00* | (2010.01) |
| *H01L 33/18* | (2010.01) |
| *H01L 33/32* | (2010.01) |

(52) U.S. Cl.
CPC ........... *C23C 16/303* (2013.01); *C23C 16/0236* (2013.01); *C30B 25/18* (2013.01);
(Continued)

(58) Field of Classification Search
CPC .... C30B 25/18; C30B 25/186; C30B 29/403; C30B 29/406; C23C 16/0227; C23C 16/0236; C23C 16/303; H01L 21/0242; H01L 21/0243; H01L 21/02433; H01L 21/0254; H01L 21/02658; H01L 21/2011; H01L 33/007; H01L 33/18; H01L 33/32
USPC ........... 257/94, 613, 618, 622, 623, 627, 628, 257/E21.121, 190
See application file for complete search history.

(56) References Cited

U.S. PATENT DOCUMENTS 6,870,191 B2 *   3/2005   Niki et al. ........................ 257/79
6,940,098 B1     9/2005   Tadatomo et al.
(Continued)

FOREIGN PATENT DOCUMENTS

JP          2002-164296 A       6/2002
(Continued)

OTHER PUBLICATIONS

U.S. Appl. No. 12/810,980, filed Oct. 5, 2010, Okagawa, et al.
(Continued)

*Primary Examiner* — Jay C Kim
(74) *Attorney, Agent, or Firm* — Oblon, Spivak, McClelland, Maier & Neustadt, L.L.P.

(57) ABSTRACT

A substrate for epitaxial growth of the present invention comprises: a single crystal part comprising a material different from a GaN-based semiconductor at least in a surface layer part; and an uneven surface, as a surface for epitaxial growth, comprising a plurality of convex portions arranged so that each of the convex portions has three other closest convex portions in directions different from each other by 120 degrees and a plurality of growth spaces, each of which is surrounded by six of the convex portions, wherein the single crystal part is exposed at least on the growth space, which enables a c-axis-oriented GaN-based semiconductor crystal to grow from the growth space.

18 Claims, 10 Drawing Sheets

(52) U.S. Cl.
CPC ......... *C30B 29/403* (2013.01); *H01L 21/0242* (2013.01); *H01L 21/0243* (2013.01); *H01L 21/02433* (2013.01); *H01L 21/0254* (2013.01); *H01L 21/02658* (2013.01); *H01L 33/007* (2013.01); *H01L 21/02378* (2013.01); *H01L 21/02381* (2013.01); *H01L 21/02403* (2013.01); *H01L 21/02661* (2013.01); *H01L 33/18* (2013.01); *H01L 33/32* (2013.01)
USPC .............. 257/190; 257/94; 257/613; 257/618; 257/622; 257/623; 257/627; 257/628; 257/E21.121

(56) References Cited

U.S. PATENT DOCUMENTS

| | | |
|---|---|---|
| 7,053,420 B2 | 5/2006 | Tadatomo et al. |
| 7,115,486 B2 | 10/2006 | Tadatomo et al. |
| 7,179,667 B2 | 2/2007 | Okagawa et al. |
| 7,504,324 B2 | 3/2009 | Tadatomo et al. |
| 7,589,001 B2 | 9/2009 | Tadatomo et al. |
| 2004/0048471 A1 | 3/2004 | Okagawa et al. |
| 2004/0123796 A1 | 7/2004 | Nagai et al. |
| 2009/0014751 A1* | 1/2009 | Kim et al. ............... 257/103 |
| 2011/0001158 A1* | 1/2011 | Kim et al. ............... 257/98 |

FOREIGN PATENT DOCUMENTS

| | | |
|---|---|---|
| JP | 2002-293698 A | 10/2002 |
| JP | 2003-318441 | 11/2003 |
| JP | 2006-316307 A | 11/2006 |
| WO | WO 00/55893 A1 | 9/2000 |
| WO | WO 02/23604 A1 | 3/2002 |
| WO | WO 02/075821 A1 | 9/2002 |

OTHER PUBLICATIONS

Japanese Office Action issued Sep. 17, 2013 in Patent Application No. 2009-553469 with English Translation.

* cited by examiner (a)

(b)

SUBSTRATE FOR EPITAXIAL GROWTH, PROCESS FOR MANUFACTURING GAN-BASED SEMICONDUCTOR FILM, GAN-BASED SEMICONDUCTOR FILM, PROCESS FOR MANUFACTURING GAN-BASED SEMICONDUCTOR LIGHT EMITTING ELEMENT AND GAN-BASED SEMICONDUCTOR LIGHT EMITTING ELEMENT

CROSS-REFERENCE TO RELATED APPLICATIONS

This application is a US National Stage Application of PCT/JP2009/052432, filed on Feb. 13, 2009, the text of which is incorporated by reference, and claims priority to Japanese Patent Application 2008-034275, filed on Feb. 15, 2008, the text of which is also incorporated by reference.

TECHNICAL FIELD

The present invention relates to a substrate for epitaxial growth suitable for the manufacture of a GaN-based semiconductor film consisting of a c-axis-oriented GaN-based semiconductor crystal, and particularly to a substrate for epitaxial growth in which a surface for epitaxial growth is an uneven surface.

The invention also relates to a method for manufacturing a GaN-based semiconductor film using such a substrate for epitaxial growth, a GaN-based semiconductor film obtained thereby, and a method for manufacturing a GaN-based semiconductor light emitting element using the GaN-based semiconductor film.

The invention also relates to a GaN-based semiconductor light emitting element comprising the above-mentioned substrate for epitaxial growth.

BACKGROUND ART

A GaN-based semiconductor is a compound semiconductor represented by the general formula $Al_a In_b Ga_{1-a-b} N$ ($0 \le a \le 1$, $0 \le b \le 1$, $0 \le a+b \le 1$), which is also called a III group nitride semiconductor, a nitride-based semiconductor or the like. GaN-based semiconductor light emitting elements such as an LED (light emitting diode) and an LD (laser diode), in which a pn-junction type light emitting element structure comprising the GaN-based semiconductor is formed on a substrate, have come into practical use, and are becoming widely used as light sources for display devices and illuminating devices.

Of the GaN-based semiconductor light emitting elements, in the manufacture of the LD, a GaN single crystal substrate is mainly used. On the other hand, in the manufacture of the LED, a sapphire single crystal substrate is mainly used. GaN-based semiconductor crystals having various kinds of orientations can be allowed to epitaxially grow on a single crystal substrate made of GaN or sapphire. However, used in the GaN-based semiconductor light emitting elements which have come into practical use at present is a c-axis-oriented GaN-based semiconductor crystal. Although the sapphire single crystal substrate includes a c-plane substrate, an a-plane substrate, an r-plane substrate and the like, the c-plane substrate is suitable for the manufacture of the c-axis-oriented GaN-based semiconductor crystal. Incidentally, nowadays, it has become a common view among those skilled in the art that the substrate called the c-plane substrate includes a substrate having a surface slightly inclined from the c-plane (a so-called off-angled substrate) (the same also for the a-plane substrate, the r-plane substrate and the like).

The GaN-based semiconductor crystal which epitaxially grows on the c-plane sapphire substrate becomes one comprising dislocation defects at high density which are caused by lattice mismatch. As one of methods for solving this problem, there has been developed an epitaxial growth technique which generates a lateral growth mode of a GaN-based semiconductor crystal by processing a substrate surface to an uneven surface by a method such as etching (LEPS: Lateral Epitaxy on a Patterned Substrate) (patent document 1 and patent document 2). Further, it has been known that when a GaN-based semiconductor light emitting element is formed using a sapphire substrate in which the surface for semiconductor crystal growth is processed to an uneven surface (hereinafter also referred to as a "patterned sapphire substrate"), an effect of increasing the light extraction efficiency is obtained, aside from the effect of reducing the dislocation defects (patent document 3).

Patent Document 1: WO 2000/55893 pamphlet
Patent Document 2: WO 2002/23604 pamphlet
Patent Document 3: WO 2002/75821 pamphlet

DISCLOSURE OF THE INVENTION

Problems that the Invention is to Solve

Further improvement of light-emitting efficiency has been demanded to the GaN-based semiconductor light emitting elements, together with the expanding use thereof. This is no exception also in general-purpose ones using inexpensive substrates such as sapphire single crystal substrates and silicon single crystal substrates. In order to enhance the light-emitting efficiency, it is necessary to more decrease the density of crystal defects contained in the GaN-based semiconductor crystal constituting the light emitting element, particularly in the GaN-based semiconductor crystal constituting a light emitting part. Further, it is also important to more efficiently extract the light generated inside the light emitting element to the outside of the element, that is to say, to increase the light extraction efficiency.

The invention has been made under such a background, and a main object is to provide a substrate for epitaxial growth comprising a novel uneven surface pattern which can contribute to improvement of light-emitting efficiency of a GaN-based semiconductor light emitting element.

Means for Solving the Problems

In case of epitaxially growing a c-axis-oriented GaN-based semiconductor crystal on a substrate consisting of a material different from a GaN-based semiconductor, when growth conditions where growth in a c-axis direction is properly dominant to growth in a direction perpendicular to the c-axis (lateral growth) is used, countless of fine three-dimensional crystals comprising inclined side surfaces (facets) such as <1-101> planes are formed on the surface of the substrate in an early stage of the growth. When the three-dimensional crystals further grow, the three-dimensional crystals meet one another before long, and coalescence occurs. At this time, changes in growth mode occur, and the growth surface of the crystal is two-dimensionalized (planarized). Accompanying this, a dislocation line propagating in the c-axis direction in the inside of the crystal is bent in a lateral direction. As a result, the density of threading dislocation reaching the surface of the finally obtained film decreases. Such growth conditions can be found by usual trial-and-error for optimization of growth parameters (the carrier gas species, the growth pressure, the growth temperature and the like).

By the way, even when the above-mentioned growth conditions are used, the coalescence of the three-dimensional crystals progresses at an accelerating pace on the substrate in which the surface for epitaxial growth is a flat surface. Accordingly, the two-dimensionalization of the growth surface completes within a short period of time, and dislocation reduction by the above-mentioned mechanism does not sufficiently occur. On the other hand, the coalescence of the three-dimensional crystals which grow in respective regions is inhibited on the substrate of which the surface for epitaxial growth is an uneven surface, that is to say, on the substrate in which crystal-growable regions are spatially separated by steps, so that the two-dimensionalization of the growth surface is delayed. As a result, the dislocation reduction effect by the above-mentioned mechanism is maintained for a long period of time.

The invention has been made based on the finding that the above-mentioned dislocation reduction effect obtained with the substrate having an uneven surface as the surface for epitaxial growth is further enhanced by contriving a pattern of the uneven surface.

According to the invention, provided is a substrate for epitaxial growth comprising:

a single crystal part comprising a material different from a GaN-based semiconductor at least in a surface layer part; and an uneven surface, as a surface for epitaxial growth, comprising: a plurality of convex portions arranged so that each of the convex portions has three other closest convex portions in directions different from each other by 120 degrees; and a plurality of growth spaces, each of which is surrounded by six of the convex portions, wherein the single crystal part is exposed at least on the growth space, which enables a c-axis-oriented GaN-based semiconductor crystal to grow from the growth space.

A first feature of the above-mentioned substrate for epitaxial growth according to the invention is that the growth space (which correspond to the bottom surfaces of the concave portion) surrounded by six of the convex portions is provided on the surface for epitaxial growth, and that the c-axis-oriented GaN-based semiconductor crystal is growable from this space. The above-mentioned convex portions are two-dimensionally arranged so that each of them has three other closest convex portions in directions different from each other by 120 degrees. Accordingly, the shape of the above-mentioned growth space is an equilateral hexagon or a shape close thereto. For this reason, when the GaN-based semiconductor crystal is allowed to grow on this substrate under growth conditions where the growth in the c-axis direction is properly dominant to the lateral growth, in each of the growth spaces, a hexagonal pyramidal or hexagonal truncated pyramidal three-dimensional crystal fitting to the size of the growth space is formed. In the crystal having such a shape, the ratio of the area of a side surface to the volume is large, so that the high dislocation reduction effect occurs at the time when the growth surface of the crystal is two-dimensionalized. This is because it is the dislocation line, which has reached the side surface of the crystal in the process in which the three-dimensional crystal is formed, that varies the propagating direction following this growth mode change.

A second feature of the above-mentioned substrate for epitaxial growth according to the invention is that the uneven pattern of the surface for epitaxial growth is set so that the above-mentioned growth spaces are most closely packed. This makes maximum the density of the hexagonal pyramidal or hexagonal truncated pyramidal crystals formed on the surface for epitaxial growth when the above-mentioned conditions are used. Accordingly, the dislocation reduction effect occurring at the time when the growth surface of the crystal is two-dimensionalized also becomes maximum.

On the other hand, the single crystal part can also be exposed to the convex portion so that the epitaxial growth is also allowed on the convex portion. However, a restriction of the shape which can be taken by the crystal is small on the convex portion, so that the GaN-based semiconductor crystal shows a tendency of spontaneously exhibiting an energetically stable pyramidal or truncated pyramidal shape.

In the above-mentioned substrate for epitaxial growth according to the invention, the growth spaces each surrounded by six of the convex portions are most closely packed, as described above. This also means that the density of steps as boundaries between the concave portions and the convex portions is maximized on the surface for epitaxial growth. Because of scattering and diffused reflection of light occurring at the steps, the GaN-based semiconductor light emitting element constituted to comprise this substrate for epitaxial growth becomes one having excellent light extraction efficiency.

The preferred shape of the above-mentioned growth space is an equilateral hexagon. This is because when the c-axis-oriented GaN-based semiconductor crystal grows three-dimensionally, the shape easily formed as an energetically stable shape is a hexagonal pyramidal or hexagonal truncated pyramidal shape. When the growth space is equilateral hexagonal, the hexagonal pyramidal or hexagonal truncated pyramidal GaN-based semiconductor crystal fitting to the shape of this growth space is stably formed. Accordingly, the two-dimensionalization of the growth surface of the crystal becomes latest, so that the effect of dislocation reduction by the above-mentioned mechanism is maintained for a longest period of time.

Incidentally, when the shape of the above-mentioned growth space is an equilateral hexagon, the pattern formed by the convex portions and the growth spaces becomes a kagome pattern, when planarly viewed.

In an embodiment, the above-mentioned uneven surface may be one formed by dry etch processing of the single crystal part using an etching mask having a kagome pattern provided with equilateral hexagonal openings. Depending on processing conditions, the pattern of the uneven surface formed deviates from the ideal kagome pattern in some cases by deformation of the etching mask during processing, even when the etching mask of the kagome pattern is used.

In the above-mentioned substrate for epitaxial growth according to the invention, the above-mentioned single crystal part may be present only in the surface layer part of the substrate. Further, the above-mentioned substrate for epitaxial growth according to the invention may be a single crystal substrate of which the whole is composed of one single crystal. In a preferred embodiment, the above-mentioned substrate for epitaxial growth is a single crystal sapphire substrate, particularly a c-plane sapphire substrate, having an uneven surface formed by dry etch processing.

When a c-axis-oriented GaN-based semiconductor crystal grows to a hexagonal pyramidal or hexagonal truncated pyramidal shape, the side surface thereof is liable to be an r-plane (it can also be said that a window of growth conditions where the side surface becomes the r-plane is wider than a window of growth conditions where the side surface becomes other surface(s)). For this reason, a preferred embodiment of the substrate for epitaxial growth is so constituted that a straight line connecting the centers of two adjacent growth spaces mentioned above is parallel to an a-axis of the c-axis-oriented GaN-based semiconductor crystal growing from the growth space. This is because when the hexagonal pyramidal or hexagonal truncated pyramidal crystal having the r-plane as the side surface is formed, such a constitution allows the crystal shape to fit to the growth space shape.

In the above-mentioned substrate for epitaxial growth according to the invention, a surface of the convex portion provided on the surface for epitaxial growth may be a surface on which no GaN-based semiconductor crystal can grow. For example, the surface of the convex portion may be formed with amorphous silicon oxide or silicon nitride which is a material used in a growth mask in an ELO (Epitaxial Lateral Overgrowth) method. Alternatively, an anti-surfactant material may be adsorbed on the surface of the convex portion. The surface of the convex portion is formed as a curved surface expanding outward, thereby inhibiting the growth of the GaN-based semiconductor crystal on the surface in some cases.

Advantages of the Invention

A low-dislocation-density and high-quality GaN-based semiconductor film suitable for a light emitting element can be formed by using the substrate for epitaxial growth of the invention.

Further, a GaN-based semiconductor light emitting element constituted to comprise the substrate for epitaxial growth of the invention has a high light extraction efficiency and an excellent light emission power, so that it can be suitably used for applications requiring high output power, such as illumination.

BRIEF DESCRIPTION OF THE DRAWINGS

FIG. 8 is views showing a structure of a substrate for epitaxial growth according to an embodiment of the invention, wherein FIG. 8(a) is a plan view, and FIG. 8(b) is a cross-sectional view taken along line X-Y in FIG. 8(a).

EXPLANATION OF REFERENCE

Figure 1:
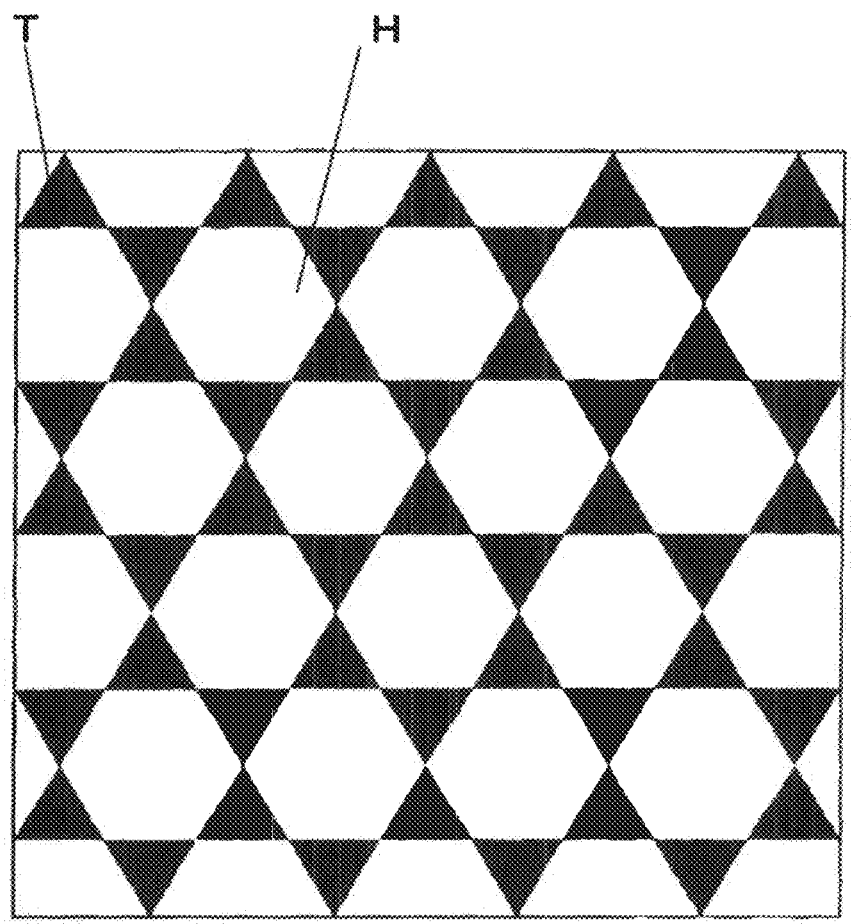
FIG. 1 is a view for illustrating a pattern of a photoresist film used as an etching mask when the substrate for epitaxial growth according to Example was prepared.

1: Substrate for epitaxial growth
2: GaN-based semiconductor light emitting element
11: Convex portion
12: Growth space
21: Substrate for epitaxial growth
22: Undoped layer
23: n-Type contact layer
24: n-Type clad layer
25: Active layer
26: p-Type clad layer
27: p-Type contact layer
28: Positive-side electrode

BEST MODE FOR CARRYING OUT THE INVENTION (Substrate for Epitaxial Growth)

Figure 8:
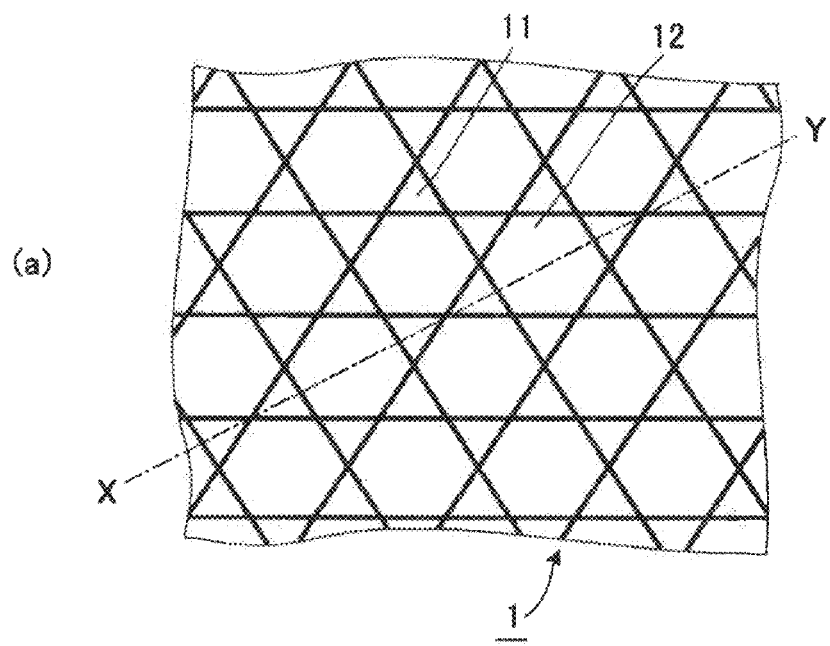
Figure 8:
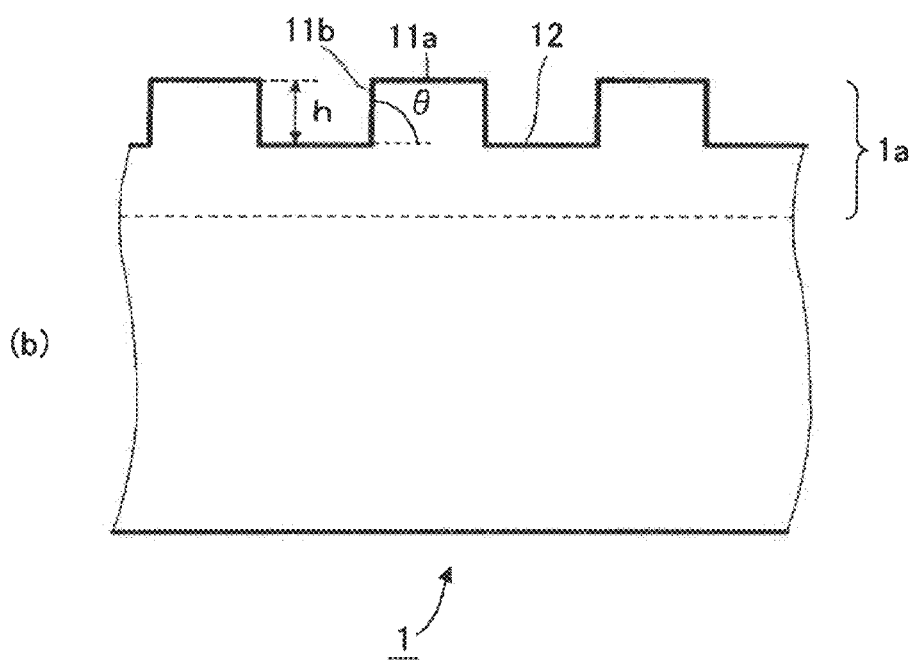

A structure of a substrate for epitaxial growth according to an embodiment of the invention is shown in FIG. 8. FIG. 8(a) is a plan view of a surface for epitaxial growth of the substrate, which is observed from a right above direction, and FIG. 8(b) is a cross-sectional view taken along line X-Y in FIG. 8(a).

Figure 9:
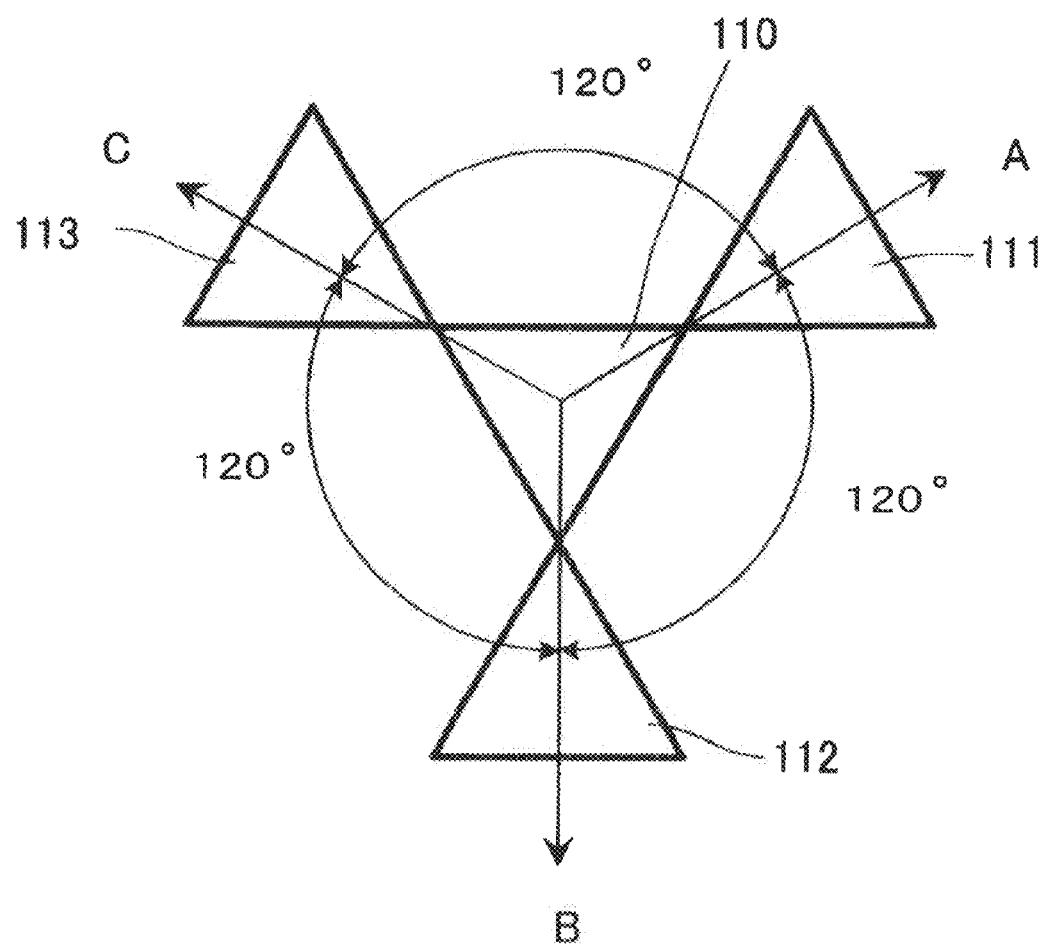
FIG. 9 is a view for illustrating an arrangement of convex portions on a surface for epitaxial growth.

The substrate for epitaxial growth 1 comprises a single crystal part 1a composed of a material different from a GaN-based semiconductor in a surface layer part. On a surface for epitaxial growth made into an uneven surface, a plurality of convex portions 11 are arranged and a plurality of growth spaces 12 each of which is surrounded by six of the convex portions 11 are provided. Explaining the arrangement of the convex portions 11 by using FIG. 9, all the convex portions 11 each has three other closest convex portions 111, 112 and 113 in directions A, B and C different from each other by 120 degrees, as a convex portion 110 shown in FIG. 9.

The surface of the growth space 12 is an exposed surface of the single crystal part 1a, and a c-axis-oriented GaN-based semiconductor crystal can be epitaxially grown from the growth space 12 by making this surface a specific crystal surface. Publicly known arts may be referred to for such a crystal surface, but, to cite some examples, there are a c-plane of sapphire, an a-plane of sapphire, a (0001) plane of 6H—SiC, a (111) plane of magnesia spinel, a (111) plane of silicon, a c-plane of ZnO and the like.

Figure 10:
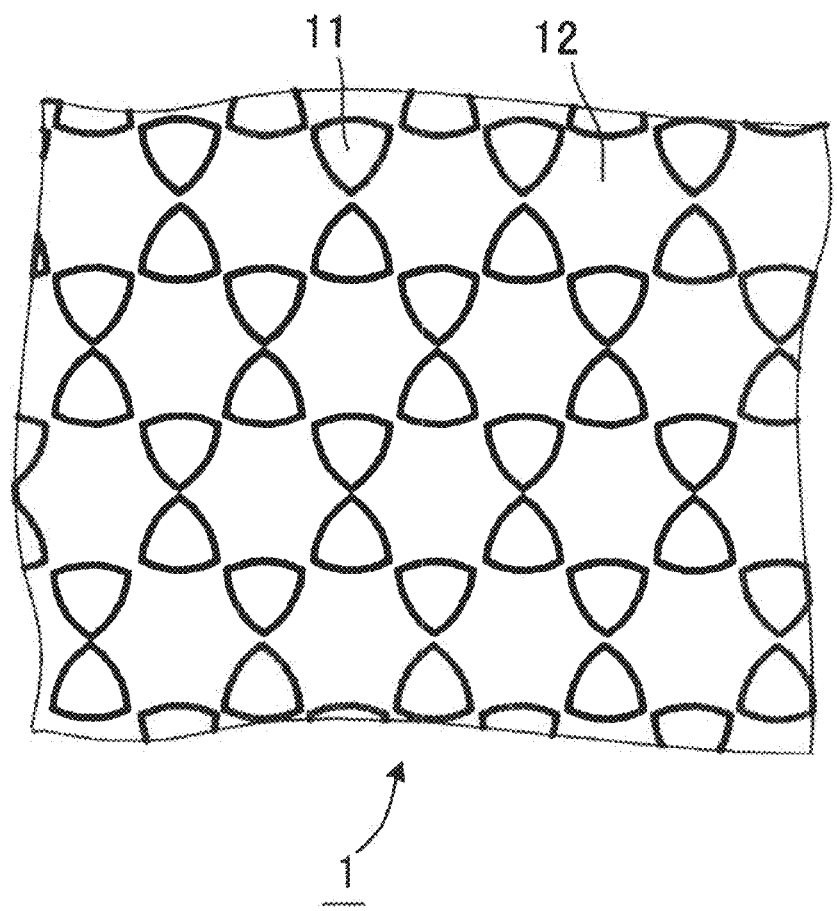
FIG. 10 is a plan view showing a structure of a substrate for epitaxial growth according to an embodiment of the invention.
Figure 11:
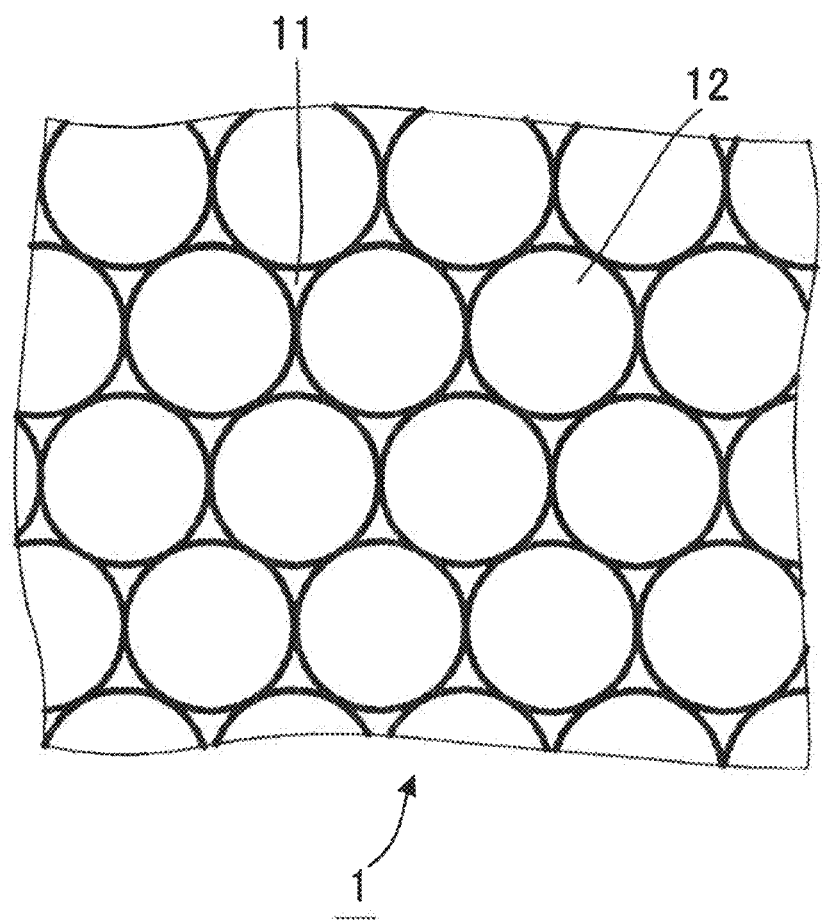
FIG. 11 is a plan view showing a structure of a substrate for epitaxial growth according to an embodiment of the invention.

In the example of FIG. 8, the shape of an upper surface 11a of the convex portion is an equilateral triangle, but is not limited thereto. Basically, it is only necessary that the shape has threefold rotational symmetry. Plan views of uneven surfaces of the substrates for epitaxial growth in which the upper surfaces of the convex portions have a shape other than the equilateral triangle, which is observed from a right above direction, are shown in FIG. 10 and FIG. 11.

When the upper surface 11a of the convex portion 11 is equilateral-triangular or has a shape close thereto, the distance between apexes thereof (in the case of the equilateral triangle, it is equal to the length of one side) is preferably from 0.5 μm to 5 μm, more preferably from 1 μm to 3 μm, and particularly preferably from 1.5 μm to 2.5 μm. When this distance is too large, because the number density of the growth spaces 12 which can be formed on the surface for epitaxial growth decreases, the dislocation reduction effect is lowered and the sufficient light extraction efficiency is not obtained when a light emitting element is formed on this substrate.

The angle θ between a side surface 11b of the convex portion 11 and the surface of the growth space 12 is preferably from 45 degrees to 90 degrees, more preferably from 60 degrees to 90 degrees, and particularly preferably from 70 degrees to 90 degrees. When this angle θ is too small, because an outline of the growth space 12 becomes indistinct, the crystal tends to protrude from the growth space 12 to two-dimensionally grow, resulting in a decrease in the dislocation reduction effect.

The height h of the convex portion 11 is preferably from 0.2 μm to 5 μm, more preferably from 0.5 μm to 3 μm, and particularly preferably from 1 μm to 2 μm. When the height h of the convex portion 11 is too small, because the outline of the growth space 12 becomes indistinct, the crystal tends to protrude from the growth space 12 to two-dimensionally grow, resulting in a decrease in the dislocation reduction effect. Further, when the height h of the convex portion 11 is small, the degree of scattering or diffused reflection of light due to the convex portion 11 decreases. When the height h of the convex portion 11 is too large, the growth time necessary until the two-dimensionalization of the growth surface of the crystal which epitaxially grows on the uneven surface is excessively prolonged.

(GaN-Based Semiconductor Light Emitting Element)

Figure 12:
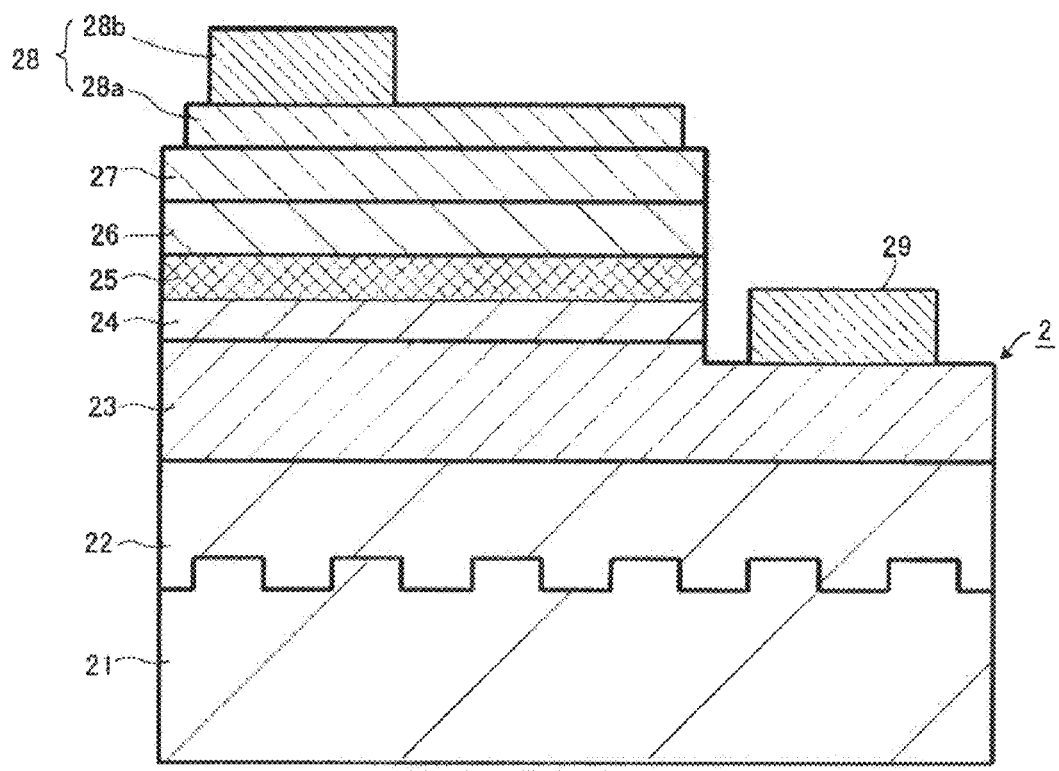
FIG. 12 is a cross-sectional view showing a structure of a GaN-based semiconductor light emitting element according to an embodiment of the invention.

A cross-sectional view of a GaN-based semiconductor light emitting element according to an embodiment of the invention is shown in FIG. 12. In this GaN-based semiconductor light emitting element 2, an undoped layer 22, an n-type contact layer 23, an n-type clad layer 24, an active layer 25, a p-type clad layer 26 and a p-type contact layer 27, which are composed of GaN-based semiconductor crystals, are provided on a substrate for epitaxial growth 21 in this order with the interposition of a buffer layer (not shown). A positive-side electrode 28 comprising a positive ohmic electrode 28a and a bonding pad 28b is formed on the p-type contact layer 27, and a negative-side electrode 29 for both an ohmic electrode and a bonding pad is formed on a surface of the n-type contact layer 23 partially exposed by dry etch processing.

The substrate for epitaxial growth 21 is a substrate according to an embodiment of the invention, comprises a single crystal part composed of a material different from a GaN-based semiconductor at least in a surface layer part thereof, and has an uneven surface, as a surface for epitaxial growth, comprising a plurality of convex portions arranged so that each of them has three other closest convex portions in directions different from each other by 120 degrees, and a plurality of growth spaces, each of which is surrounded by six of the said convex portions. The said single crystal part is exposed at least on the said growth space. The GaN-based semiconductor crystal layers from the undoped layer 22 to the p-type contact layer 27 are c-axis oriented and epitaxially grown on this substrate 21.

The undoped layer 22 is a GaN layer comprising no intentionally added impurity and having a film thickness of 2 μm to 6 μm. The n-type contact layer 23 is a GaN layer doped with Si (silicon) as an n-type impurity and having a carrier concentration of $1 \times 10^{18}$ cm$^{-3}$ to $2 \times 10^{19}$ cm$^{-3}$ and a film thickness of 2 μm to 6 μm. The n-type clad layer 24 is an AlGaN layer or an InGaN layer doped with Si as an n-type impurity and having a carrier concentration of $1 \times 10^{17}$ cm$^3$ to $5 \times 10^{18}$ cm$^{-3}$ and a film thickness of 10 nm to 500 nm. The active layer 25 has a multiquantum well structure in which $In_{x1}Ga_{1-x1}N$ ($0<x1 \leq 1$) well layers having a film thickness of 1 nm to 10 nm and $In_{x2}Ga_{1-x2}N$ ($0 \leq x2 < x1$) barrier layers having a film thickness of 1 nm to 20 nm are alternately laminated. The barrier layer of the active layer is preferably doped with Si, and when the emission wavelength is less than 400 nm, either or both of the well layer and the barrier layer is preferably formed of a mixed crystal comprising AlN. The p-type clad layer 26 is an $Al_{y1}Ga_{1-y1}N$ ($0.05<y1 \leq 0.4$) layer doped with Mg (magnesium) at a concentration of $1 \times 10^{19}$ cm$^{-3}$ to $5 \times 10^{20}$ cm$^{-3}$ and having a film thickness of 10 nm to 200 nm. The p-type contact layer 27 is an $Al_{y2}Ga_{1-y2}N$ ($0 \leq y1 \leq 0.05$) layer doped with Mg (magnesium) at a concentration of $5 \times 10^{19}$ cm$^{-3}$ to $5 \times 10^{20}$ cm$^{-3}$ and having a film thickness of 20 nm to 200 nm.

The positive ohmic electrode 28a is preferably formed with a transparent conductive oxide such as ITO (indium tin oxide), indium oxide, tin oxide, zinc oxide or IZO (indium zinc oxide). In the bonding pad 28b, preferably, the part in contact with the positive ohmic electrode is formed with Al, Ag, Ni or a platinum group metal, and the surface layer part is formed with Au. In the negative electrode 29, preferably, the part in contact with the n-type contact layer 23 is formed with Al, Ti, W or the transparent conductive oxide, and the surface layer part is formed with Au.

The invention will be described more specifically below with reference to examples.

Example 1

A photoresist film for an etching mask was formed on a mirror-finished surface of a c-plane sapphire substrate with a diameter of 2 inches, one surface of which being mirror finished for epitaxial growth. Then, by using photolithography technique, this photoresist film was formed into a pattern shown by parts marked out black in FIG. 1. In the pattern consisting of triangles T and hexagons H shown in FIG. 1, all the triangles T are equilateral triangles having the same area, and all the hexagons H are equilateral hexagons having the same area. Each of the hexagons is arranged so that the center thereof is positioned at a lattice point of a triangular lattice. Such a pattern consisting of the triangles T and the hexagons H is a pattern called a kagome pattern. The direction of the photoresist film pattern was determined in such a manner that each side of the triangle becomes parallel to an m-axis of sapphire, and the length of each side of the triangle was set to 2 μm.

After patterning the photoresist film, concave portions having a depth of 1 μm were formed on parts of the surface of the substrate covered with no photoresist film, by using a reactive ion etching (RIE) method. The selectivity of RIE at this time was adjusted to 0.9. That is to say, the etching rate of sapphire was adjusted to be 0.9 times the etching rate of the photoresist film.

Figure 2:
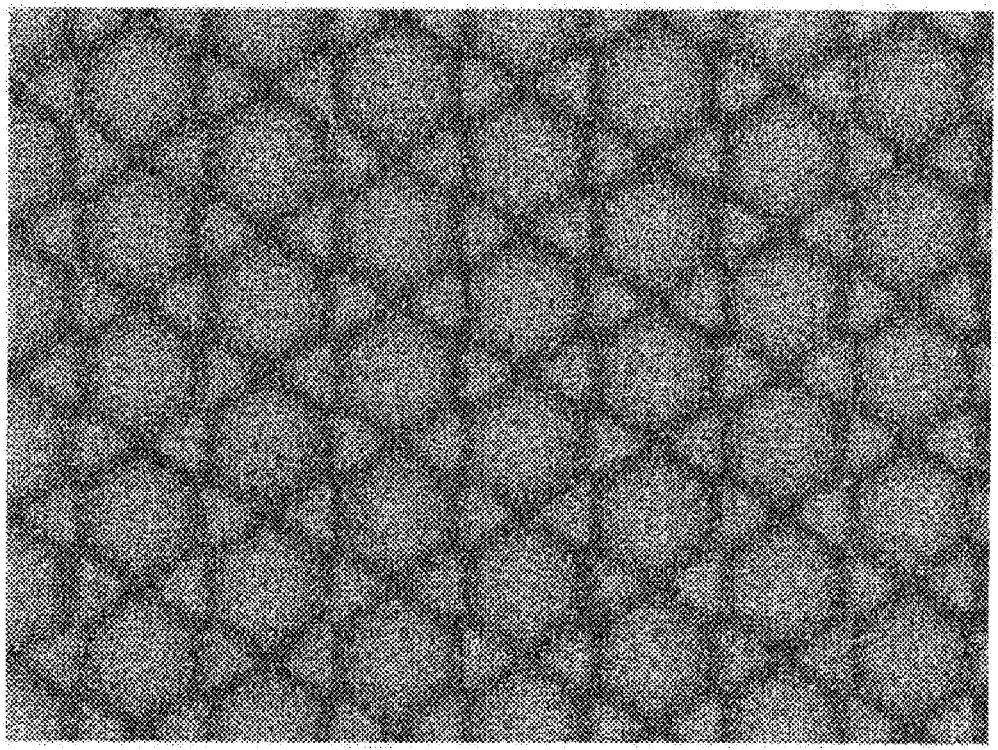
FIG. 2 is a SEM image of the uneven surface of the substrate for epitaxial growth according to Example, which was observed from a right above direction.

After forming the concave portions, the photoresist film was removed from the substrate by using a remover liquid, and further, in order to completely remove also a residue thereof, the processed substrate surface was exposed to oxygen plasma. A SEM image of the uneven surface of the patterned sapphire substrate thus obtained, which is observed from a right above direction, is shown in FIG. 2. This shows that there is formed an uneven surface pattern having a convex portion pattern corresponding to the pattern of the etching mask, that is to say, the uneven surface pattern in which triangular prism or triangular truncated pyramid convex portions each having an equilateral-triangular upper surface and equilateral hexagonal spaces each separating the convex portions (each of them is surrounded by six of the convex portions) are arranged so as to form a kagome pattern, when viewed from above.

Example 2

The patterned sapphire substrate prepared in Example 1 was placed in a growth furnace of a MOVPE apparatus, and the surface cleaning was performed by heating in a hydrogen gas atmosphere. Thereafter, the substrate temperature was lowered to 400° C. to allow an AlGaN low-temperature buffer layer to grow 10 mm on the uneven surface.

Continuously, the substrate temperature was increased to a temperature at which a single crystal grows, and undoped GaN was grown using trimethylgallium (TMG) as a group 3 raw material and ammonia as a group 5 raw material. The amounts of gases supplied into the growth furnace at this time were 30 slm for a nitrogen gas, 20 slm for a hydrogen gas and 10 slm for ammonia, and the amount of TMG supplied was 200 µmol/min. The growth time was a time corresponding to the growth of 1 µm on an usual flat substrate.

Figure 3:
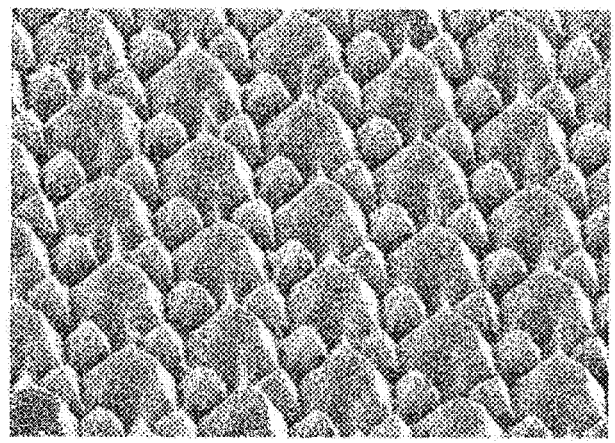
FIG. 3 is a SEM image showing a state of growth of GaN crystals on the substrate for epitaxial growth according to Example.
Figure 4:
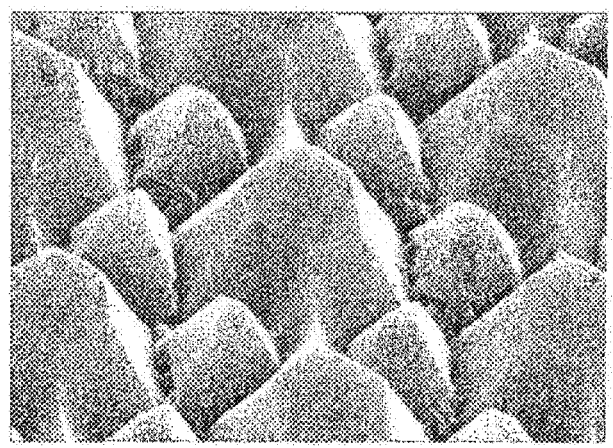
FIG. 4 is a SEM image showing a state of growth of GaN crystals on the substrate for epitaxial growth according to Example.

A SEM image of the surface of the wafer on which the GaN crystal was thus grown, which was observed from an oblique direction, is shown in FIG. 3. Further, a SEM image of the same surface, which was observed at a higher magnification, is shown in FIG. 4. These SEM images show that a facet structure GaN crystal having a side surface inclined from a thickness direction of the substrate has grown from each of an upper surfaces of the convex portion and the equilateral hexagonal space separating the convex portions (the space surrounded by six of the convex portions), formed on the surface of the substrate.

Example 3

An undoped GaN crystal was grown on the patterned sapphire substrate prepared in Example 1, in the same manner as in Example 2. However, although the growth time of the undoped GaN crystals was a time corresponding to the growth of 1 µm on the usual flat substrate in Example 2, it was a time corresponding to the growth of 4 µm on the usual flat substrate in this Example 3. The growth surface of the undoped GaN crystal became flat by prolonging the growth time as described above although using the same conditions as in Example 2.

Further, after growing the undoped GaN crystal, in order to form a light emitting element structure, a Si-doped GaN layer (for both a clad layer and a contact layer), an InGaN/GaN active layer and a Mg-doped AlGaN layer were grown in this order. The Si-doped GaN layer was adjusted to have a Si concentration of $5\times10^{18}$ cm$^{-3}$ and a film thickness of 4 µm. The InGaN/GaN active layer was prepared so as to have a multiquantum well structure in which InGaN well layers and GaN barrier layers are alternately laminated. The Mg-doped AlGaN layer was prepared to have a two-layer structure in which a contact layer consisting of $Al_{0.03}Ga_{0.97}N$ with a thickness of 40 nm was laminated on a clad layer consisting of $Al_{0.09}Ga_{0.91}N$ with a thickness of 170 nm.

Figure 5:
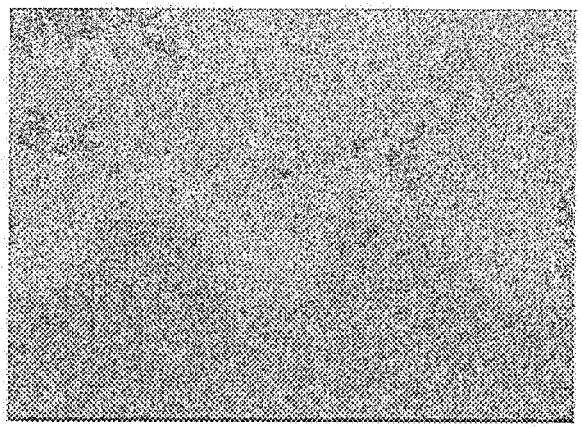
FIG. 5 is a cross-sectional SEM image of an epitaxial layer composed of a GaN-based semiconductor formed on the substrate for epitaxial growth according to Example.
Figure 6:
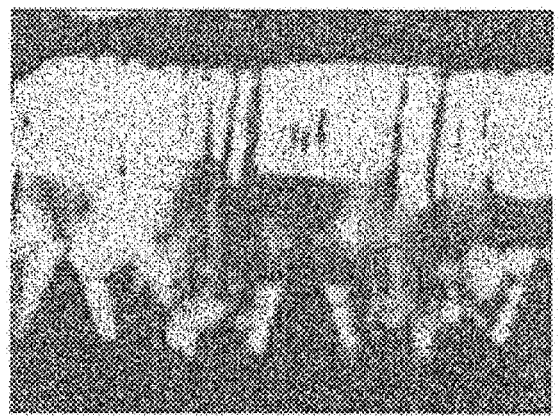
FIG. 6 is a cathodoluminescence image of a cross section of an epitaxial layer composed of a GaN-based semiconductor formed on the substrate for epitaxial growth according to Example.

The epitaxial wafer thus prepared was broken, and the cross section of the epitaxially grown layer part was observed by SEM. As a result, it could be confirmed that the undoped GaN crystal had grown so as to fill the concave portions of the patterned sapphire substrate, as shown in FIG. 5. Further, a cathode luminescence image (CL image) of the cross section of the epitaxially grown layer part was obtained. As a result, triangular regions different from their surroundings in brightness were clearly observed in parts adjacent to the respective concave portions of patterned sapphire substrate, as shown in FIG. 6. This revealed that planarization of the growth surface occurred through a state where hexagonal pyramidal crystals had grown on the respective equilateral hexagonal spaces of the patterned sapphire substrate, in the course of growth of the undoped GaN crystal.

Figure 7:
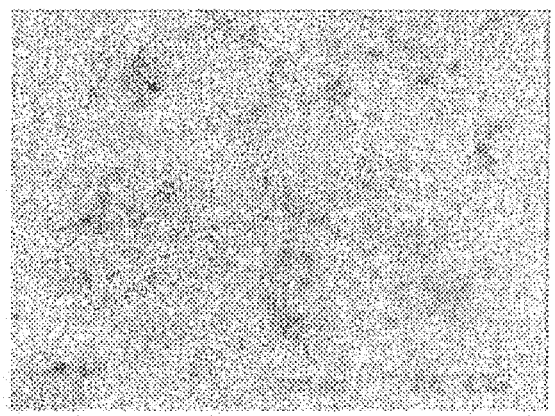
FIG. 7 is a cathodoluminescence image of a surface of an epitaxial layer composed of a GaN-based semiconductor formed on the substrate for epitaxial growth according to Example.

Further, a cathode luminescence image of the surface of the epitaxially grown layer was obtained. As a result, dark spots (parts which looked dark because of locally low efficiency of emissive recombination) appearing in parts where dislocation defects were present were dispersed independently of the uneven surface pattern of the patterned sapphire substrate, as shown in FIG. 7. This result well corresponds with the SEM observations (FIG. 3 and FIG. 4) in Example 2. In other words, in an initial stage of growth of the undoped GaN layer, the facet structure crystal grows from each of the upper surface of the convex portion and the equilateral hexagonal space of the patterned sapphire substrate, so that bending of the dislocation line occurs above both the upper surface of the convex portion and the equilateral hexagonal space in the subsequent course of planarization of the growth surface. As a result, distribution of the dislocation lines reaching the surface of the epitaxial layer comes not to reflect the uneven surface pattern of the patterned sapphire substrate. Incidentally, the in-plane density of the above-mentioned dark spots (nearly equal to the dislocation defect density) on the surface of the epitaxial layer was as low as $1\times10^8$ cm$^{-2}$.

Example 4

Positive and negative electrodes were formed in respective element-forming parts of the epitaxial wafer prepared in Example 3. An ITO film was formed as a positive ohmic electrode on the $Al_{0.03}Ga_{0.97}N$ contact layer, and a metallic bonding pad was formed on a part of the ohmic electrode. A negative-side electrode for both an ohmic electrode and a bonding pad was formed on a surface of the Si-doped GaN layer partially exposed by RIE. After the electrode formation, the back surface of the patterned sapphire substrate was lapped to reduce the thickness of the wafer to 100 µm or less, and the wafer was divided into the respective element-forming parts by using a scriber, thereby obtaining a 350 µm square plate-like GaN-based semiconductor light emitting element chip. This light emitting element chip was flip-chip mounted on a stem via a submount, and the emission power at the time when a current of 20 mA was applied in a bare chip state was measured by using an integrating sphere. As a result, it showed a value as high as 15 mW.

Comparative Example

A patterned sapphire substrate was prepared in the same manner as in Example 1 with the exception that the pattern of the photoresist film was changed to a pattern in which circles having a diameter of 2 µm were each arranged at a lattice point of a triangular lattice. In the pattern, the distance between centers of two adjacent circles was set to 4 µm. The surface of the resulting patterned sapphire substrate was an uneven surface in which a plurality of truncated cone convex portions having a diameter of the upper surface being slightly smaller than that of the bottom surface were each arranged at a lattice point of a triangular lattice. An epitaxial wafer was prepared in the same manner as in Example 3 with the exception that this patterned sapphire substrate was used, and the density of dislocation defects on the surface of the epitaxial layer was examined. As a result, it was $2\times10^8$ cm$^{-2}$. Further, a light emitting element chip was prepared in the same manner as in Example 4 with the exception that this patterned sapphire substrate was used, and the emission power was measured. As a result, it was 13 mW.

The invention is not limited to the embodiments or examples described expressly in the specification and drawings, and various variations are possible without departing from the spirit of the invention.

This application is based on Japanese Patent Application (Japanese Patent Application No. 2008-034275) filed on Feb. 15, 2008, the contents of which are incorporated herein by reference.

The invention claimed is:

1. A substrate comprising:
a single crystal part comprising a material different from a GaN-based semiconductor, wherein
the single crystal part comprises
an uneven surface comprising a plurality of convex portions arranged so that each of the convex portions has three other closest convex portions in directions different from each other by 120 degrees, and
a plurality of growth spaces, each of which is surrounded by six of the convex portions,
wherein the single crystal part is exposed at least on a growth space, which enables a c-axis-oriented GaN-based semiconductor crystal to grow from the growth space, and
wherein the growth spaces are flat surfaces and the growth spaces are isolated from each other by two of the plurality of convex portions.

2. The substrate according to claim 1, wherein the convex portions and the growth spaces form a kagome pattern wherein a hexagonal growth surface is surrounded by six triangular convex portions, when the substrate for epitaxial growth is planarly viewed.

3. The substrate according to claim 1, wherein the uneven surface is formed by dry etch processing of a surface of the single crystal part using an etching mask that has a kagome pattern provided with equilateral hexagonal openings wherein said kagome pattern has equilateral triangles and equilateral hexagons in which the equilateral hexagons are arranged so that the center of each equilateral hexagon is positioned at the center of the area defined by the neighboring triangles.

4. The substrate according to claim 1, wherein the plurality of convex portions are a part of the single crystal part.

5. The substrate according to claim 1, wherein the single crystal part is composed of a sapphire.

6. The substrate according to claim 5, wherein the substrate is composed of a single crystal sapphire.

7. The substrate according to claim 6, wherein the uneven surface is formed by dry etch processing of a c-plane sapphire substrate.

8. A method for manufacturing a GaN-based semiconductor film, the method comprising:
crystal growth of the c-axis-oriented GaN-based semiconductor crystal on the substrate according to claim 1.

9. The method for manufacturing a GaN-based semiconductor film according to claim 8, the crystal growth further comprising
forming one hexagonal pyramidal or hexagonal truncated pyramidal GaN-based semiconductor crystal on each of the growth spaces of the substrate.

10. A GaN-based semiconductor film manufactured by the manufacturing method according to claim 9.

11. A method for manufacturing a GaN-based semiconductor light emitting element, the method comprising;
forming a plurality of GaN-based semiconductor crystal layers comprising at least an active layer and two clad layers sandwiching the active layer by epitaxial growth on the GaN-based semiconductor film according to claim 10.

12. A GaN-based semiconductor light emitting element comprising:
the substrate for epitaxial growth according to claim 1; and
a GaN-based semiconductor film formed by epitaxially growing a c-axis-oriented GaN-based semiconductor crystal on the substrate,
wherein the GaN-based semiconductor film comprises a plurality of GaN-based semiconductor crystal layers comprising at least an active layer and two clad layers sandwiching the active layer.

13. A substrate being formed by dry etch processing of a c-plane substrate and comprising:
an uneven surface having a triangular prismatic or triangular truncated pyramidal convex portion which has an approximately equilateral-triangular upper surface; and
a growth space being equilaterally hexagonal surrounded by six convex portions which are arranged so as to form a kagome pattern wherein a hexagonal growth surface is surrounded by six triangular convex portions, when planarly viewed, and
wherein the growth space is a flat surface and the growth space is isolated from an adjacent growth space in the kagome pattern by two of the convex portions.

14. A substrate being formed by processing a c-plane substrate, comprising:
an uneven surface having a plurality of convex portions, each having an upper surface that are arranged so that each of the convex portions has three other convex portions in directions different from each other by 120 degrees; and
a plurality of growth spaces which are surrounded by six of the convex portions, and
wherein the growth spaces are flat surfaces and the growth spaces are isolated from each other by two of the plurality of convex portions.

15. A method for manufacturing a GaN-based semiconductor film, the method comprising:
an epitaxial growth of a c-axis-oriented GaN-based semiconductor crystal on the substrate according to claim 14.

16. A GaN-based semiconductor film comprising:
a c-axis-oriented GaN-based semiconductor crystal epitaxially grown on the substrate according to claim 14.

17. A method for manufacturing a GaN-based semiconductor light emitting element, the method comprising:
forming a plurality of c-axis-oriented GaN-based semiconductor crystal layers comprising at least an active layer and two clad layers sandwiching the active layer by epitaxial growth on the substrate according to claim 14.

18. A GaN-based semiconductor light emitting element comprising:
the substrate according to claim 14; and
a GaN-based semiconductor film comprising a c-axis-oriented GaN-based semiconductor crystal epitaxially grown on the substrate,
wherein the GaN-based semiconductor film comprises a plurality of GaN-based semiconductor crystal layers comprising at least an active layer and two clad layers sandwiching the active layer.

* * * * *